,

US008445181B2

(12) United States Patent
Yao et al.

(10) Patent No.: US 8,445,181 B2
(45) Date of Patent: May 21, 2013

(54) ANTIREFLECTIVE COATING COMPOSITION AND PROCESS THEREOF

(75) Inventors: Huirong Yao, Plainsboro, NJ (US); Jain Yin, Bridgewater, NJ (US); Guanyang Lin, Whitehouse Station, NJ (US); Mark Neisser, Whitehouse Station, NJ (US); David Abdallah, Bernardsville, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 316 days.

(21) Appl. No.: 12/792,994

(22) Filed: Jun. 3, 2010

(65) Prior Publication Data
US 2011/0300488 A1    Dec. 8, 2011

(51) Int. Cl.
| G03F 7/30 | (2006.01) |
| C09D 5/33 | (2006.01) |
| C09D 125/02 | (2006.01) |
| C09D 133/14 | (2006.01) |
| C09D 179/04 | (2006.01) |
| C09D 179/08 | (2006.01) |

(52) U.S. Cl.
USPC .................. 430/311; 430/271.1; 525/160

(58) Field of Classification Search
None
See application file for complete search history.

(56) References Cited

U.S. PATENT DOCUMENTS

| 3,474,054 A | 10/1969 | White |
| 4,200,729 A | 4/1980 | Calbo |
| 4,251,665 A | 2/1981 | Calbo |
| 4,491,628 A | 1/1985 | Ito et al. |
| 5,187,019 A | 2/1993 | Calbo et al. |
| 5,350,660 A | 9/1994 | Urano et al. |
| 5,410,005 A | 4/1995 | Nemoto et al. |
| 5,843,624 A | 12/1998 | Houlihan et al. |
| 6,297,521 B1 | 10/2001 | Forbes et al. |
| 6,447,980 B1 | 9/2002 | Rahman et al. |
| 6,686,124 B1 | 2/2004 | Angelopoulos et al. |
| 6,723,488 B2 | 4/2004 | Kudo et al. |
| 6,790,587 B1 | 9/2004 | Feiring et al. |
| 6,818,258 B2 | 11/2004 | Kaneko et al. |
| 6,849,377 B2 | 2/2005 | Feiring et al. |
| 6,866,984 B2 | 3/2005 | Jung et al. |
| 6,916,590 B2 | 7/2005 | Kaneko et al. |
| 7,588,879 B2 | 9/2009 | Brodsky et al. |
| 7,691,556 B2 | 4/2010 | Wu et al. |
| 7,998,664 B2 | 8/2011 | Noya et al. |
| 8,039,201 B2 | 10/2011 | Yao et al. |
| 2005/0214674 A1 | 9/2005 | Sui et al. |
| 2006/0105248 A1 | 5/2006 | Montgomery et al. |
| 2006/0134547 A1 | 6/2006 | Huang et al. |
| 2006/0263720 A1 | 11/2006 | Mori |
| 2007/0042289 A1 | 2/2007 | Thackeray et al. |
| 2010/0009297 A1 | 1/2010 | Yao et al. |

FOREIGN PATENT DOCUMENTS

| EP | 1 298 493 A2 | 4/2003 |
| JP | 1-221702 A | 9/1989 |
| JP | 7-316268 A | 12/1995 |
| JP | 2005-221963 A | 8/2005 |
| WO | WO-2009/066169 A1 * | 5/2009 |

OTHER PUBLICATIONS

Woollam et al, "OVerview of Variable Angle Spectroscopic Ellipsometer (VASE), Part I: Basic Theroy and Typical Applications", Optical Metrology, Porceedings of a Conference held Jul. 18-19, 1999, Dever, Colorado, 1999 by Society of Photo-Optical Instumentation Engineers, 28 pages.*
Form PCT/ISA/220, Form PCT/ISA/210, Form PCT/ISA/237 for PCT/IB2008/003215 dated Apr. 14, 2009 which corresponds to U.S. Appl. No. 11/944,105.
Form PCT/ISA/220, Form PCT/ISA/210, Form PCT/ISA/237 for PCT/IB2011/001229 dated Sep. 27, 2011 which corresponds to U.S. Appl. No. 12/792,994.
Machine Language English Abstract from JPO of JP 1-221702 A, downloaded Jul. 25, 2011.
Abdallah et al, "192nm dual layer organic B.A.R.C.s for high NA immersion lithography", SPIE vol. 5753, pp. 417-pp. (2005).
Switkes et al., "Immersion Liquids for Lithography in the Deep Ultraviolet", SPIE vol. 5040, pp. 690-pp. 699 (2003).
"aliphatic", Grant & Hackh's Chemical Dictionary, Fifth Ed., Grant et al. eds, McGraw-Hill Book Company, Year 1987 no month, p. 22, printed in the United States of America.
"aliphatic compounds", IUPAC Goldbook, http://goldbookiupac.org/A00217.html, original source, PAC, 1995, 67, 1307 (glossary of class names or organic compounds and reactivity intermediates based on structure (IUPAC Recommendation 995) on p. 1313.

* cited by examiner

*Primary Examiner* — Cynthia Hamilton
(74) *Attorney, Agent, or Firm* — Sangya Jain

(57) ABSTRACT

The invention related to an antireflective coating comprising a mixture of a first polymer and a second polymer, and a thermal acid generator, where the first polymer comprises at least one fluoroalcohol moiety, at least one aliphatic hydroxyl moiety, and at least one acid moiety other than fluoroalcohol with a pKa in the range of about 8 to about 11; where the second polymer is a reaction product of an aminoplast compound with a compound comprising at least one hydroxyl and/or at least one acid group. The invention further relates to a process for using the novel composition to form an image.

16 Claims, 5 Drawing Sheets

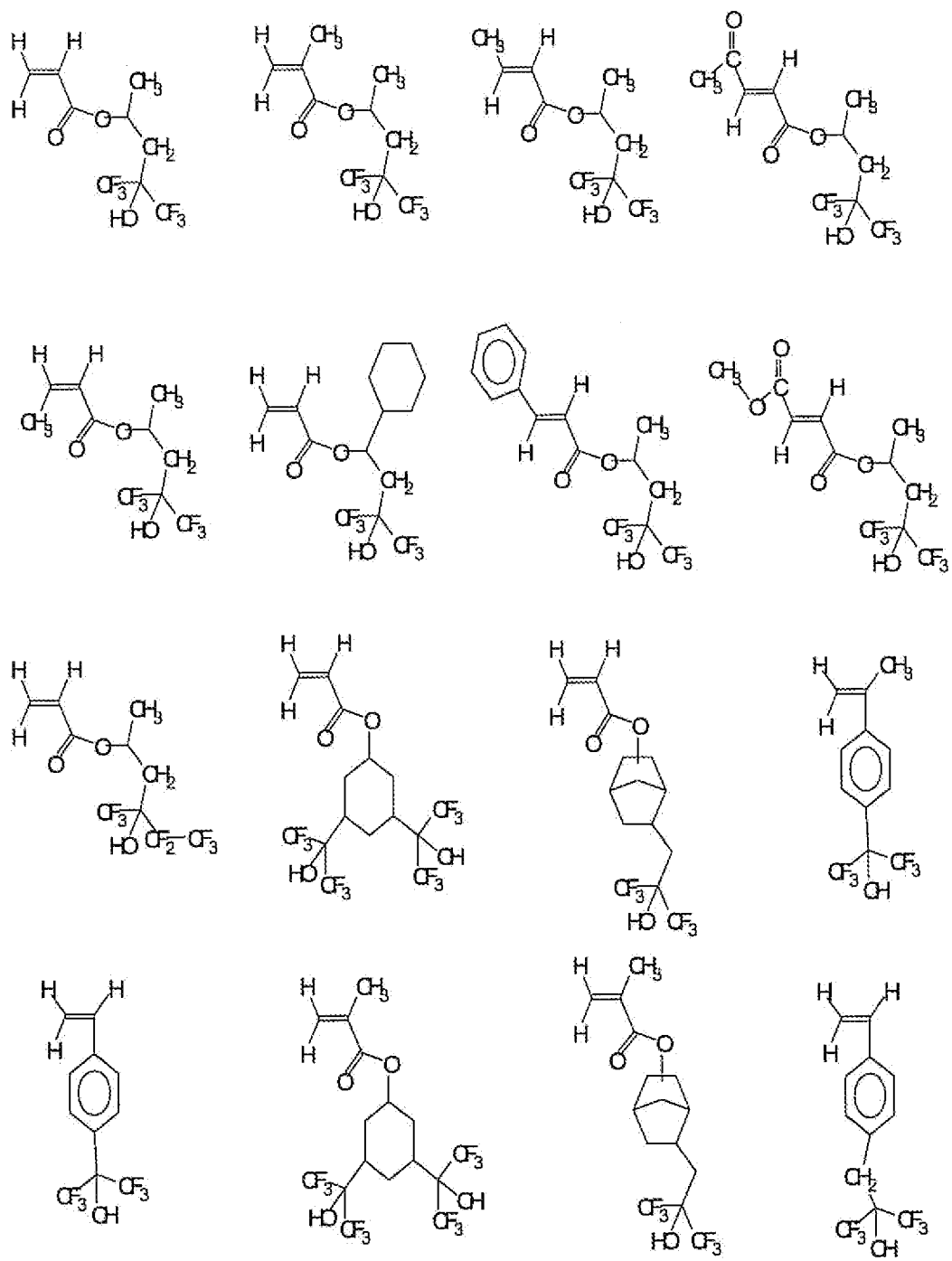
Figure 1: Examples of monomers for P1

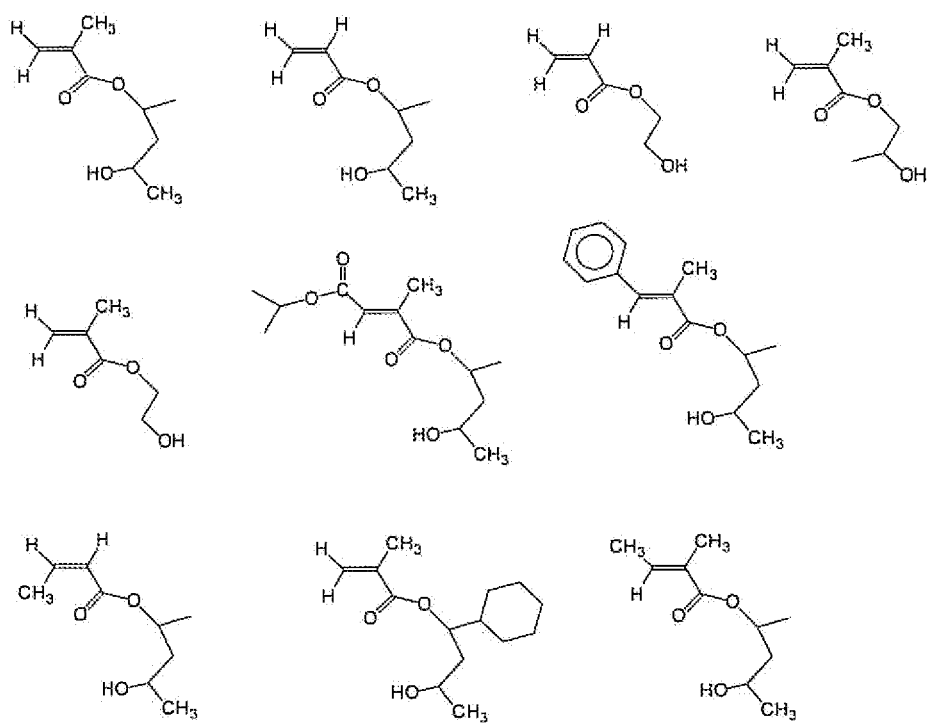
Figure 2: Examples of monomers for $P_2$

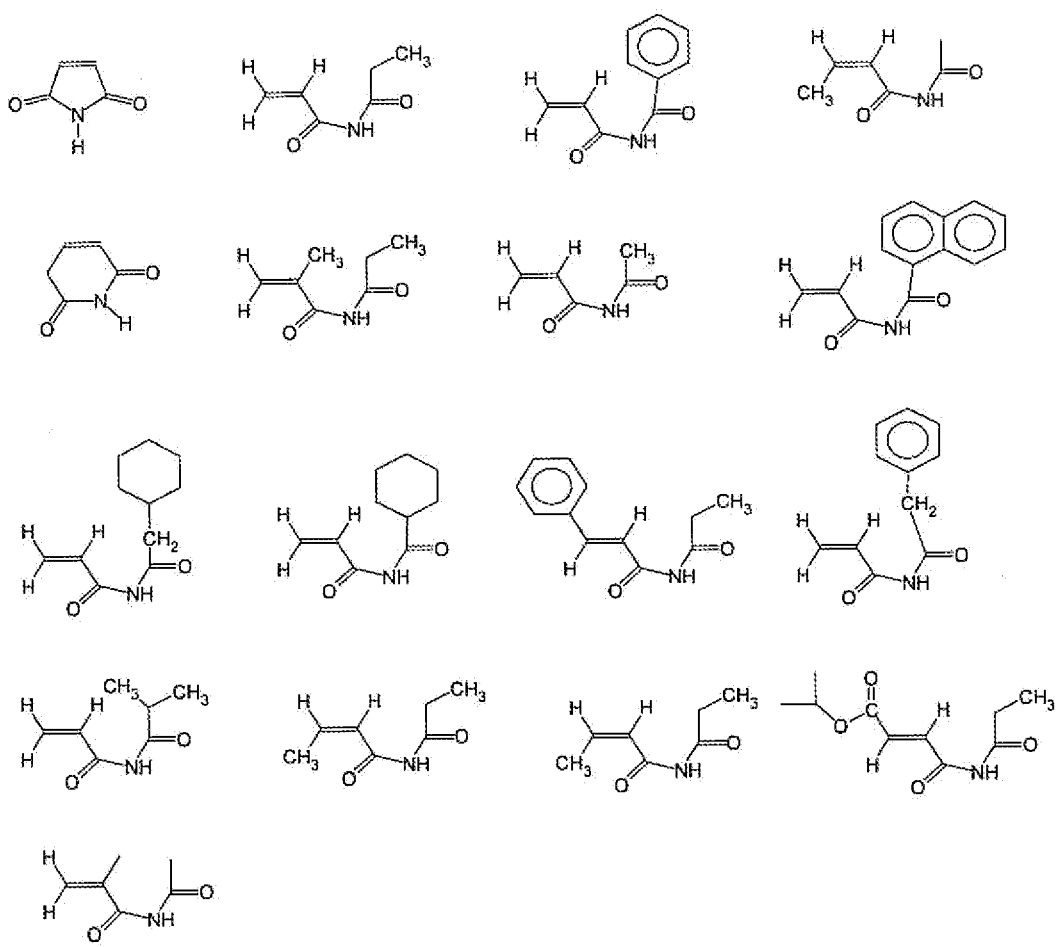
Figure 3: Examples of monomers for P₃

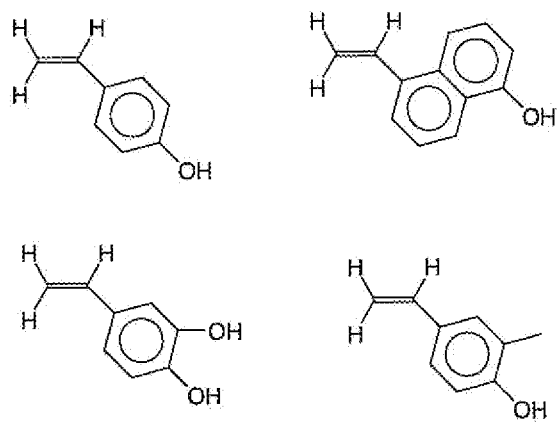
Figure 4: Examples of monomers for $P_4$
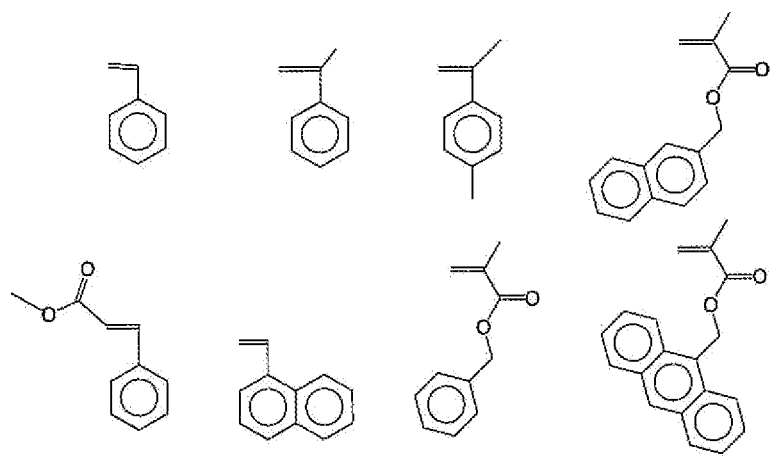
Figure 5: Examples of monomers for $P_5$

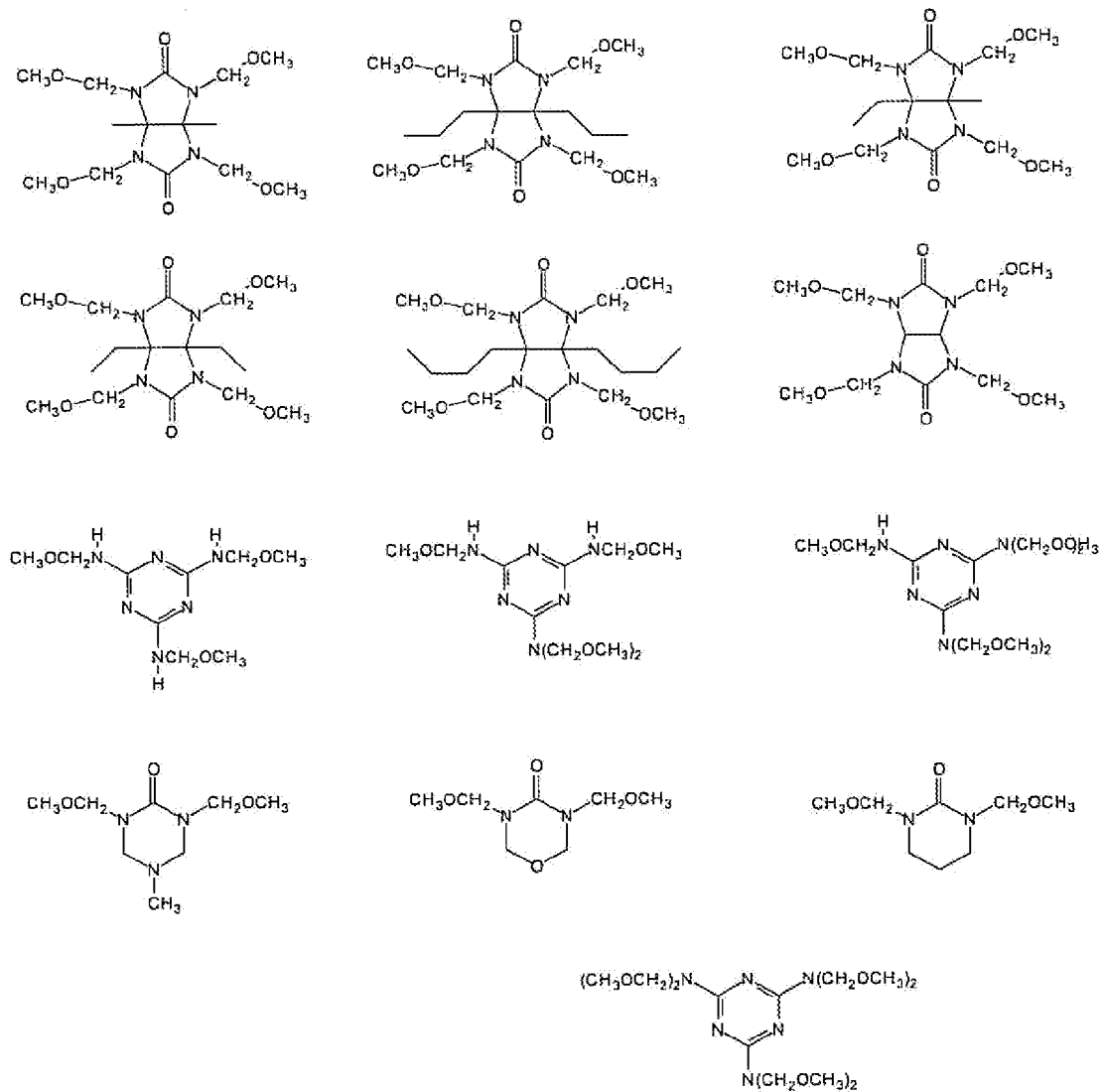
Figure 6: Examples of aminoplasts

ANTIREFLECTIVE COATING COMPOSITION AND PROCESS THEREOF

The present invention relates to a novel absorbing bottom antireflective coating composition (BARC). The antireflective coating composition comprises a blend of two polymers chosen so as to give a hydrophobic acidic top layer for the BARC. The invention further relates to a process for imaging photoresist coated over the novel antireflective coating.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with developer solution to dissolve and remove either the radiation-exposed or the unexposed areas of the photoresist.

The trend towards the miniaturization of semiconductor devices has led to the use of new photoresists that are sensitive to shorter and shorter wavelengths of radiation and has also led to the use of sophisticated multilevel systems to overcome difficulties associated with such miniaturization. Absorbing antireflective coatings and underlayers in photolithography are used to diminish problems that result from back reflection of light from highly reflective substrates.

In order to further improve the resolution and depth of focus of photoresists, immersion lithography is a technique that has been used to extend the resolution limits of deep ultraviolet (uv) lithography imaging. The process of immersion lithography is described in 'Immersion liquids for lithography in deep ultraviolet' Switkes et al., Proceedings of SPIE Vol. 5040 (2003), pages 690-699.

In order to form patterns in a photoresist film at pitches less than $0.5\lambda/NA$ ($\lambda$ is the wavelength of the exposing radiation and NA is the numerical aperture of the lens for exposure), one technique that has been used is double patterning. Double patterning provides a method for increasing the density of photoresist patterns in a microelectronic device. Typically in double patterning a first photoresist pattern is defined on a substrate at pitches greater than $0.5\lambda/NA$ and then in another step a second photoresist pattern is defined at the same pitch as the first pattern between the first photoresist pattern. Both images are transferred simultaneously to the substrate with the resulting pitch that is half of the single exposures.

Conventional single layer BARC's are not adequate in the controlling reflectivity to less than 1% for all incident angles in lithographic applications where the NA exceeds 1.0 Abdallah et al., Proceedings of SPIE Vol. 5753 (2005), pages 417-435. Graded BARC's with tuned n and k values offer improved reflectivity control. Initially, such materials were based on inorganic films prepared using Chemical Vapor Deposition CVD as in U.S. Pat. No. 6,297,521. More recently, (Brodsky et al U.S. Pat. No. 7,588,879 B2) graded organic BARC's have been described that can be formed in one spin coating operation from a mixture of two polymers that phase separate from each other and have different optical properties. Immersion and Double patterning/immersion lithographies are some of the most useful and important technologies for manufacturing devices, particularly for 32 nm feature imaging and beyond in the integrated circuit industry. It is desirable to have antireflective coating compositions where BARCs which have finely tuned BARC wetability by developer after exposure and minimal undesirable exchange interaction between BARC and photoresist is critical for good lithographic performance, such as reflectivity control and footing/scum reduction, especially in immersion and double patterning/immersion lithographies.

The present novel antireflective coating composition is useful for immersion lithography as well as immersion lithography/double patterning applications, where the antireflective coating has a surface contact angle closely matching that of the photoresist used in immersion lithography, but also has a good contact angle with developer after exposure in which the developed photoresist has good lithographic performance, being free of scum and defects.

SUMMARY OF THE INVENTION

The present invention relates to an antireflective coating comprising a mixture of a first polymer and a second polymer, and a thermal acid generator, where the first polymer comprises at least one fluoroalcohol moiety, at least one aliphatic hydroxyl moiety, and at least one acid moiety other than fluoroalcohol with a pKa in the range of about 8 to about 11; where the second polymer is a reaction product of an aminoplast compound with a compound comprising at least one hydroxyl and/or at least one acid group. The invention further relates to a process for using the novel composition to form an image.

BRIEF DESCRIPTION OF DRAWINGS

FIG. 1 shows Examples of monomers for P1
FIG. 2 shows Examples of monomers for $P_2$
FIG. 3 shows Examples of monomers for $P_3$.
FIG. 4 shows Examples of monomers for $P_4$
FIG. 5 shows Examples of monomers for $P_5$
FIG. 6 shows Examples of aminoplasts

DETAILED DESCRIPTION OF THE INVENTION

The present invention relates to an antireflective coating comprising a mixture of at least 2 polymers. The antireflective coating composition comprises at least a first polymer and at least a second polymer different from the first polymer. The first polymer comprises at least one unit with a fluoroalcohol moiety, at least one unit comprising an acidic moiety other than fluoroalcohol, and least one unit with an aliphatic alcohol. The unit with the acidic moiety may be an imide or aromatic alcohol (such as phenol, naphthol, etc). In one embodiment, the acidic moiety may have a pKa in the range of about 8-11. The first polymer may further comprise at least one unit comprising an aromatic moiety. The novel composition comprises a second polymer which is a polymerization reaction product of an aminoplast compound with a reactive compound comprising at least one hydroxy group and/or at least one acid group. In one embodiment the reactive compound comprises 2 or more hydroxy groups (polyhydroxy compound or polyol), a compound containing 2 or more acid groups (polyacid compound), or a hybrid compound containing both a hydroxy and an acid group. The second polymer may comprise reactive aminomethylenealkoxy or aminomethylenehydroxy moieties ($N-CH_2-OR$, R=alkyl or H). Furthermore, the second polymer is less hydrophobic than the first polymer, thus allowing the first of polymer to migrate towards the surface of the coated film from the novel antireflective coating composition. The novel composition is capable of forming an optically graded antireflective coating where there is a gradation in the refractive index and absorption in the film. The antireflective composition further comprises a Thermal Acid Generator (TAG) whose function is to enhance cross-linking. The solid components of the composition are dissolved in an organic solvent.

The novel antireflective coating composition comprises at least two polymers, a first polymer and a second polymer. The first polymer comprises three repeat units, at least one of $P_1$, at least one of $P_2$, at least one of $P_3$ and/or $P_4$, and an optional repeat unit ($P_5$). The composition of the first polymer type may exemplified by the following structure (I).

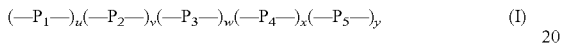

(I)

where $P_1$ is a monomeric unit comprising a fluoroalcohol moiety, $P_2$ is a monomeric unit comprising an aliphatic alcohol group; $P_3$ is a monomeric unit comprising an imide moiety; $P_4$ is a monomeric unit comprising a base (alkali) ionizable arylhydroxy moiety; $P_5$ is an optional monomeric repeat unit comprising an aryl chromophore moiety; u, v, w, x, y are representative of the mole % proportion of repeat units in a polymer chain and where u, v, are greater than 0, at least one of w and x is greater than zero and y is zero or greater. $P_2$ is a nonfluorinated aliphatic alcohol. In one embodiment the polymer comprises $P_1$, $P_2$, $P_3$ and optionally $P_5$. In another embodiment the polymer comprises $P_1$, $P_2$, $P_4$ and optionally $P_5$. In another embodiment the polymer comprises $P_1$, $P_2$, $P_3$ and $P_4$, and optionally $P_5$.

In the first polymer, the unit $P_1$ comprising the fluoroalcohol moiety may be derived from the monomer unit having structure 2 where X is ethylenic or substituted ethylenic moiety which forms the backbone of the polymer, $Rf_1$ and $Rf_2$ are independently a fluoro($C_1$-$C_6$)alkyl group and W is selected from a direct valence bond and a spacer group. Examples of a spacer group are alkyl, alkyl ester, aryl, aralkyl and mixtures thereof. The ethylenic group may be substituted by alkyl, aryl, alkylester, alkylcarbonyl, etc. More specifically, $P_1$ may be derived from monomers of structures 3, 4, 5 and 6,

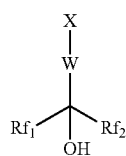

(2)

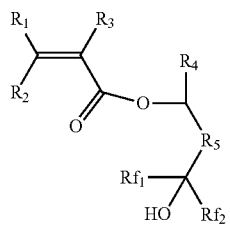

(3)

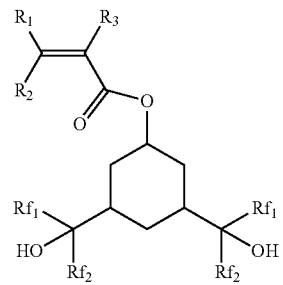

(4)

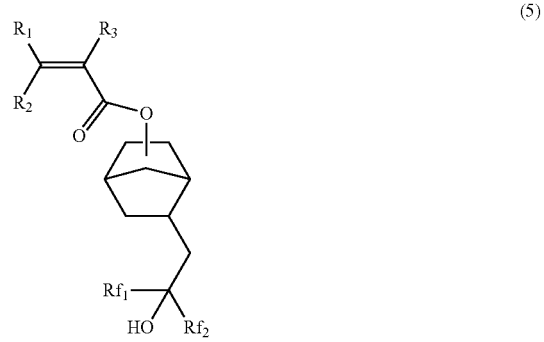

(5)

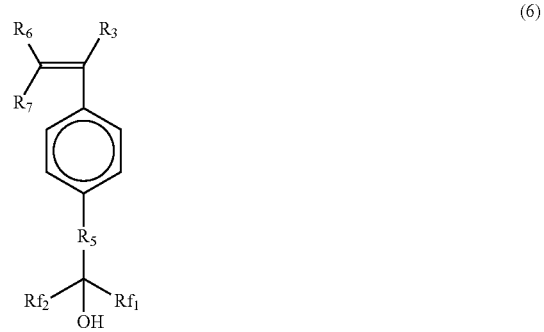

(6)

where $R_1$, $R_2$ and $R_3$ are independently selected from hydrogen and ($C_1$-$C_4$)alkyl, $R_4$ is a ($C_1$-$C_{10}$)alkyl group or an ($C_6$-$C_{14}$) aryl moiety (such as phenyl, naphthyl), $R_5$ is a direct valence bond or a spacer group, where the spacer group may be alkyl, alkyl ester, aryl, aralkyl; $Rf_1$ and $Rf_2$ are independently a fluoro($C_1$-$C_6$)alkyl group (such as $CF_3$, $CF_2CF_3$, $CH(CF_3)_2$, $CF(CF_3)_2$ and the like); $R_6$ and $R_7$ are independently selected from hydrogen, ($C_1$-$C_{10}$)alkyl group, an aryl moiety ($C_6$-$C_{14}$) (such as phenyl naphthyl), a ($C_2$-$C_8$)carbonyloxyalkyl (such as $CO_2$—$OCH_3$), and ($C_2$-$C_8$) carbonyl (such as formyl, acetyl). Examples of $R_4$ are linear ($C_1$-$C_{10}$) alkyl group (such as methyl, ethyl, n-propyl), branched ($C_3$-$C_{10}$)alkyl group (such as isopropyl, isobutyl), ($C_5$-$C_{12}$)cyclic alkyl group (such as cyclohexyl, cyclopentyl). Examples of $R_5$ are a direct valence bond or a spacer group such as those selected from a linear alkylene ($C_1$-$C_{10}$) (such as methylene, ethylene), branched alkylene ($C_3$-$C_{12}$) cycloalkylene ($C_5$-$C_{12}$), and arylene spacer group ($C_6$-$C_{14}$) (such as phenylene, naphthylene). Further examples of $R_6$ and $R_7$ are a linear alkyl group ($C_1$-$C_{10}$), (such as methyl, ethyl, n-propyl), branched alkyl group ($C_3$-$C_{10}$) (such as isopropyl, isobutyl) and a cyclic alkyl group ($C_5$-$C_{12}$) (such as cyclohexyl, cyclopentyl). Generally herein and throughout alkyl refers to linear, branched, cyclic or mixtures thereof. FIG. 1 shows specific non-limiting examples of fluoroalcohol moiety bearing monomers from which would be derived the $P_1$ repeat unit from the general structure 2.

In the first polymer, the unit $P_2$, which is the repeat unit comprising the aliphatic alcohol group is derived from the monomer having structure (7) where $R_1$, $R_2$, and $R_3$, are as described previously, $R_4'$ is hydrogen or an $(C_1\text{-}C_{10})$alkyl group, and $R_9$ is selected from a direct bond and a $(C_1\text{-}C_{12})$ alkyl spacer group. $R_9$ may be an alkylene spacer group $(C_1\text{-}C_{10})$ such as methylene ethylene ($-CH_2-$, $-CH_2CH_2-$), a branched alkylene spacer group $(C_3\text{-}C_{12})$ such as ($-CH(CH_3)_2-$), a cyclic alkylene spacer group (such a cyclopentyl or cyclohexyl ring). FIG. 2 shows specific examples of monomer structures from which the $P_2$ unit could be derived.

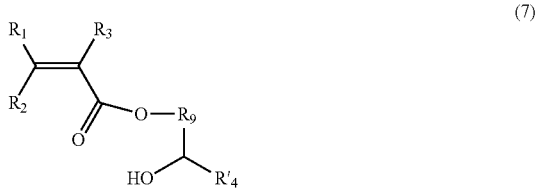

(7)

In the first polymer, the unit $P_3$ bearing the ionizable imide polymer repeat unit is derived from two possible monomer structures (8 and/or 9). Structure 8 is a cyclic imide where $R_8$ is a direct valence bond or an $(C_1\text{-}C_{10})$alkylene group. Structure 9 is a noncyclic imide where $R_1$, $R_2$ and $R_3$ are independently selected from hydrogen and $(C_1\text{-}C_4)$alkyl, $R''_4$ is a linear $(C_1\text{-}C_{10})$alkyl group or an $(C_6\text{-}C_{14})$ aryl moiety (such as phenyl, naphthyl). Examples of $R_8$ are a linear alkylene spacer group $(C_1\text{-}C_3)$, (such as methylene, ethylene) or a branched alkylene spacer group $(C_2\text{-}C_{10})$.

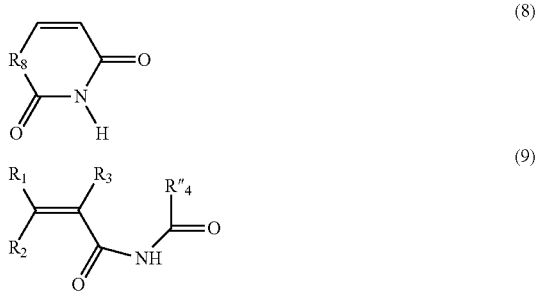

(8)

(9)

Specific non limiting examples of possible monomers from which the unit $P_3$, the imide bearing ionizable moiety, would be derived based on Structures 8 and 9 are shown in FIG. 3.

In the first polymer, the unit $P_4$ is derived from monomer units (10a) or monomer unit (10b), where Ar is independently an aryl moiety such as phenyl, naphthyl, anthracenyl and the like, $R_1$, $R_2$, $R_3$, $R_4$, $R_5$, $R_6$, and $R_7$ are as previously described and has at least one hydroxyl substituent (n=1-3 in structure 10a and 10b). FIG. 4 shows specific non restrictive examples derived from structure 10a and 10b.

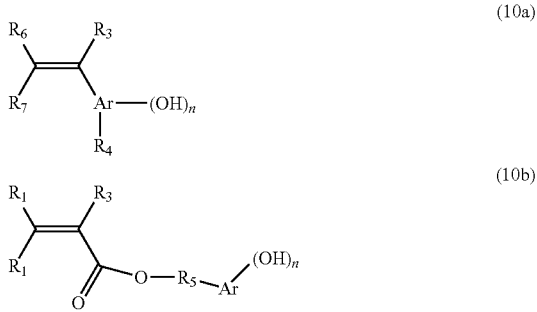

(10a)

(10b)

In the first polymer, the optional unit $P_5$, is a chromophore repeat unit and is derived from either the monomer unit (11) or the monomer unit (12), where Ar is independently an arylene moieties such as phenylene, naphthylene, anthracenylene, $R_1$, $R_2$, $R_3$, $R_4$, $R_5$, $R_6$, and $R_7$ are as previously described. $R_4$ is not hydroxyl.

(11)

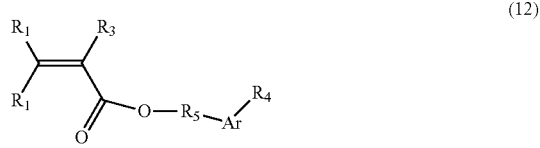

(12)

FIG. 5 shows examples of monomers of structure (11) and (12) which may be used to form the polymeric unit $P_5$.

In one embodiment of the first type of polymer, the polymer may comprise repeat derived from monomer units $P_1$, $P_2$ and $P_3$ as described herein. In one embodiment the first polymer is,

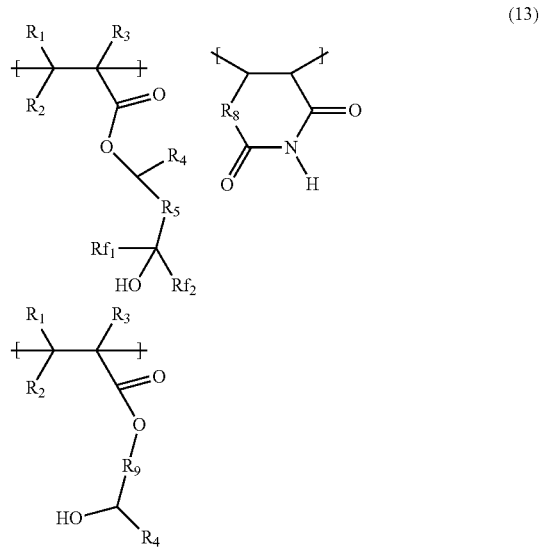

(13)

The first polymer may be represented by,

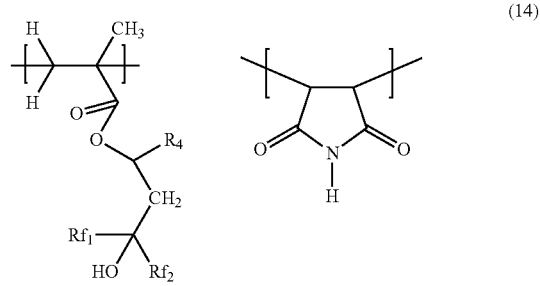

(14)

-continued

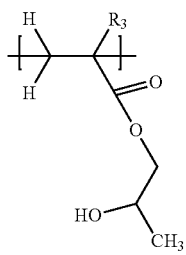

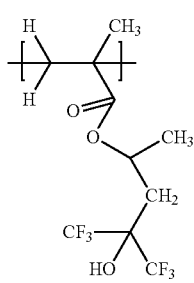

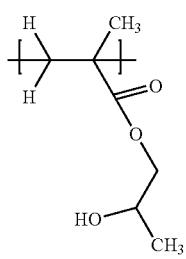

In another embodiment of the first type of polymer, the polymer be (16)

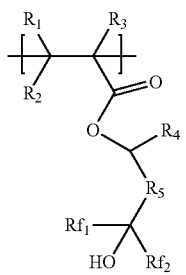

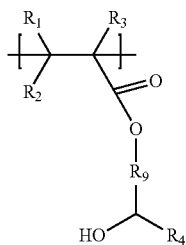

and more specifically, (17)

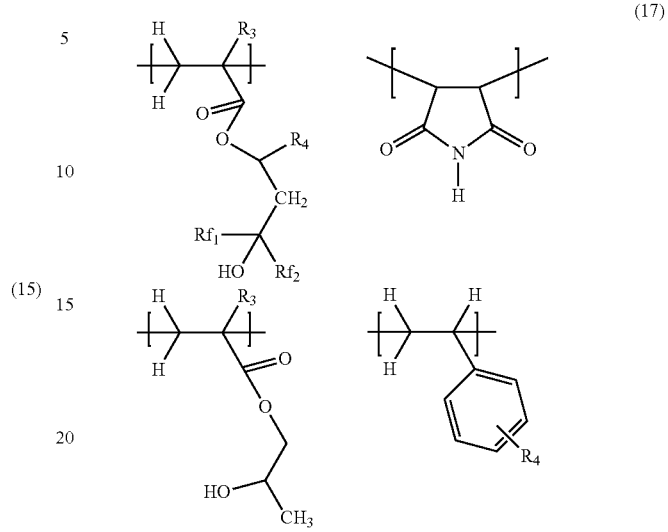

The structure for the polymers resulting from the polymerization of four specific monomers isopropyl hexafluoroisopropanol methacrylate, maleimide, hydroxypropyl methacrylate and styrene is shown in (18).

(18)

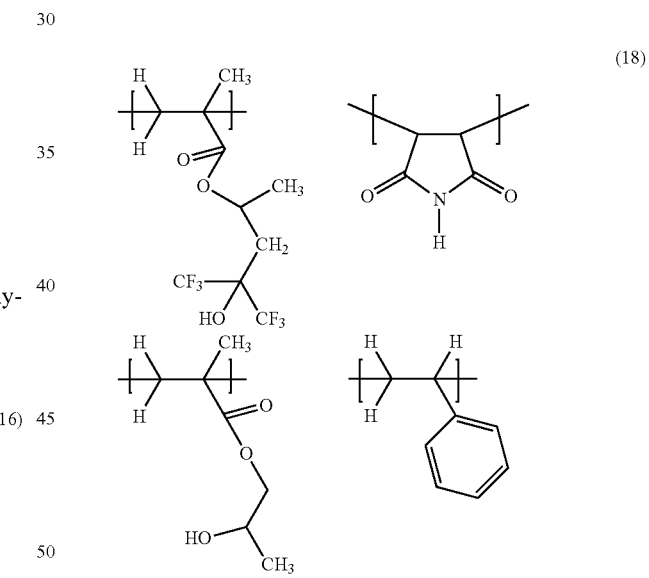

The first type of polymers of this invention may be synthesized using any known method of polymerization, such as free-radical polymerization using a catalyst. The polymer may be synthesized using solution, emulsion, bulk, suspension polymerization, or the like. The polymers of this invention are polymerized to give a polymer with a weight average molecular weight from about 1,000 to about 80,000, or 5,000 to 30,000. The molecular weight is chosen such that the first polymer coats more uniformly at the desired thickness of the graded mixture of the two types of polymers. The polydispersity (Mw/Mn) of the free-radical polymers, where Mw is the weight average molecular weight and Mn is the number average molecular weight, can range from 1.0 to 10.0, where the molecular weights of the polymer may be determined by gel permeation chromatography.

The novel composition of the present invention comprises at least two polymers which phase separate from each other with the first polymer going predominantly to the surface of the coated film. The surface of the film contains a small amount of the second polymer which crosslinks with the first polymer, thus curing the entire film. Therefore, a concentration gradient is present in the top portion of the film with the surface containing the highest amount of the first polymer and the bottom of the film containing the highest amount of the second polymer. Additionally, the two types of polymers form a cross-linked network during baking such that the coating is resistant to spin casting solvents of the photoresist coated over the novel coating. The surface of the BARC film is wetable by aqueous alkaline developer, especially after exposure and during development, thus minimizing scumming and footing of the imaged photoresist features formed on the surface of novel BARC film. Furthermore, the optical constants, refractive index and absorption, of the first and second polymers are such that the coated film has graded optical constants through the BARC film giving optimal antireflective characteristics.

The composition range of $P_1$ repeat unit in the first type of polymer ranges from about 20 to about 60 mole %. A more specific composition range is about 35 to about 50 mole %. The $P_3$ and/or $P_4$ polymer repeat unit bearing a base ionizable moiety provides good aqueous base wetability during development in an aqueous alkaline developer. $P_3$ and/or $P_4$ is in the range of about 15 to about 45 mole % or about 20 to about 30 mole %. The total mole % composition of repeat units $P_1$ and $P_3$ and/or $P_4$ the fluoroalcohol bearing and ionizable moieties respectively can be between 30 to 80 mole %, or a range of 50 to 70 mole %. The range provides good aqueous base wetability while still allowing the first type of polymers to migrate to the surface of the polymer blend. The total mole % composition of $P_2$ is 10 to 40% or 15 to 35%. The optional $P_5$ polymer repeat units bearing a UV absorbing moieties may have a composition range of 0 to 20 mole %. A composition range of 5 to 15 mole % may be used when present. This unit may be used to finely tune the optical constants so as to provide maximum antireflective properties.

The first polymer useful for this invention is chosen to have a range of contact angles with water of about 65-85° or about 70-80° which provides for a good phase separation from the second type of polymer. The first polymer has a contact angle with aqueous alkaline developer of 55-65° after the imaging process, that is after exposure and development. The developer is typically an tetramethylammonium hydroxide or 2.3 weight % tetramethylammonium hydroxide. to the novel composition minimizes footing and scumming of features imaged in photoresist coated on the BARC. Furthermore, the range of n and k at 193 nm for the first polymer should be n=1.5-1.75 and k=0.05-0.35 or n=1.55-1.70 and k=0.1-0.3. Although described are ranges of optical constants at 193 nm, similar optimal values exist for other wavelength of ultraviolet light such as 248 nm.

The novel composition of the present invention comprises a second polymer which is the condensation polymerization product of an aminoplast with a reactive compound comprising at least one hydroxy group and/or at least one acid group in the presence of a catalytic amount of a strong acid such as toluenesulfonic acid. Aminoplast polymer are described in U.S. Pat. No. 7,691,556 and US 2010/0009297, which are incorporated herein by reference. In one embodiment the reactive compound comprises 2 or more hydroxy groups (polyhydroxy compound or polyol), a compound containing 2 or more acid groups (polyacid compound), or a hybrid compound containing both a hydroxy and an acid group. The aminoplast contains reactive aminomethylenealkoxy moieties (N—$CH_2$—O-alkyl) which partially react with the compound comprising at least one hydroxyl and/or at least one carboxylic acid group to form a resin forming the second polymer. Although some of the aminomethylene react in forming the second type of polymer some of these remain unreacted so that they may self crosslink or crosslink with the graded blend of the two polymer types through the $P_3$ alcohol bearing repeat units of the first type of polymer. Typically, the aminoplast is reacted with the hydroxyl and/or acid containing compound in a solvent such as propylenegylcol monomethyether acetate (PGMEA) or similar solvents, and heated with stirring in the presence on an acid catalyst such as para-toluenesulfonic acid for several hours. The polymer is typically recovered by precipitation into water and then dried. The aminoplast to be polymerized to form the second type of polymer is selected from the group consisting of the following having either structures 19-26, where each $R_{10}$ is $CH_2$—O—$(CH_2)_m$—$CH_3$, each $R_{11}$ and $R_{12}$ are independently hydrogen or $C_1$-$C_{10}$ alkyl, and m is 0 to 3.

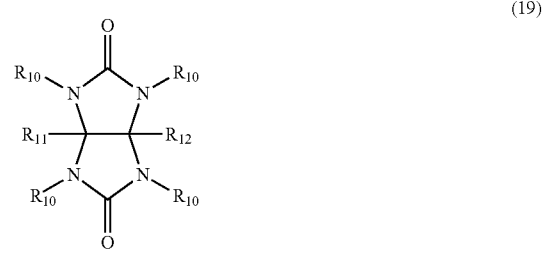

(19)

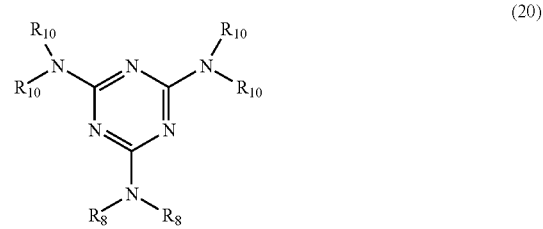

(20)

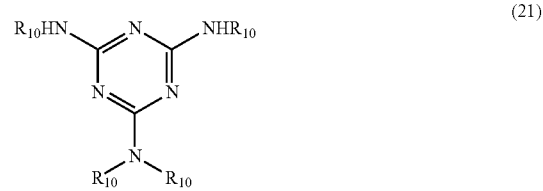

(21)

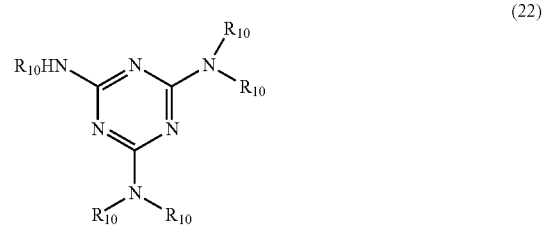

(22)

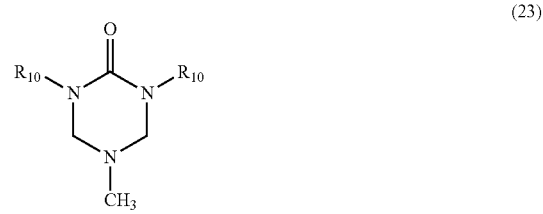

(23)

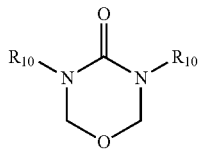

(24)

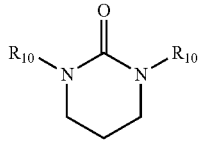

(25)

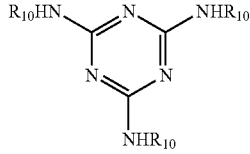

(26)

Examples of aminoplasts are such as those which are commercially available from Cytec Industries under the trademark CYMEL and from Monsanto Chemical Co. under the trademark RESIMENE. Condensation products of other amines and amides can also be employed, for example, aldehyde condensates of triazines, diazines, diazoles, guanidines, guanimines and alkyl- and aryl-substituted derivatives of such compounds, including alkyl- and aryl-substituted melamines. Some examples of such compounds are N,N'-dimethyl urea, benzourea, dicyandiamide, formaguanamine, acetoguanamine, ammeline, 2-chloro-4,6-diamino-1,3,5-triazine, 6-methyl-2,4-diamino,1,3,5-traizine, 3,5-diaminotriazole, triaminopyrimidine,2-mercapto-4,6-diamino-pyrimidine, 3,4,6-tris(ethylamino)-1,3,5-triazine, tris (alkoxycarbonylamino)triazine, N,N,N',N'-tetramethoxymethylurea and the like. Other possible aminoplasts include compounds shown in FIG. 6. Additionally, including their analogs and derivatives, such as those found in Japanese Laid-Open Patent Application (Kokai) No. 1-293339 to Tosoh, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547 to Ciba Specialty Chemicals. Various melamine and urea resins are commercially available under the Nicalacs (Sanwa Chemical Co.), Plastopal (BASF AG), or Maprenal (Clariant GmbH) tradenames may be used.

More specifically, the aminoplast may be selected from the group comprising of glycoluris having the Structure 19. Examples of glucolurils are tetra(alkoxymethyl)glycoluril, may include, e.g., tetra(methoxymethyl)glycoluril, tetra (ethoxymethyl)glycoluril, tetra(n-propoxymethyl)glycoluril, tetra(i-propoxymethyl)glycoluril, tetra(n-butoxymethyl)glycoluril, tetra(t-butoxymethyl)glycoluril, substituted tetra (alkoxymethyl)glycolurils such as 7-methyl tetra(methoxymethyl)glycoluril, 7-ethyl tetra(methoxymethyl) glycoluril, 7-(i- or n-)propyl tetra(methoxymethyl)glycoluril, 7-(i- or sec- or t-)butyl tetra(methoxymethyl)glycoluril, 7,8-dimethyl tetra(methoxymethyl)glycoluril, 7,8-diethyl tetra (methoxymethyl)glycoluril, 7,8-di(i- or n-)propyl tetra (methoxymethyl)glycoluril, 7,8-di(i- or sec- or t-)butyl tetra (methoxymethyl)glycoluril, 7-methyl-8-(i- or n-)propyl tetra (methoxymethyl)glycoluril, and the like. Tetra (methoxymethyl)glycoluril is available under the trademark POWDERLINK from Cytec Industries (e.g., POWDERLINK 1174). Other examples include methylpropyltetramethoxymethyl glycoluril, and methylphenyltetramethoxymethyl glycoluril. FIG. 6 gives examples of specific aminoplast materials. Example of the glycourils is tetramethoxymethylglycouril In the polymerization of the second polymer, one embodiment of the second compound to make the polymer may be a polyhydroxy compound chosen from a group consisting of a polyol (27) and/or a cyanuric acid derivatives (28). In structure (27) $R_{13}$ is a spacer group such as an $(C_1-C_{12})$alkylene, where alkylene may be exemplified by a linear alkylene $(C_1-C_{10})$ (such as methylene, ethylene), branched alkylene $(C_3-C_{12})$ or cycloalkylene $(C_5-C_{12})$, $R_{14}$ is selected from hydrogen and $C_1-C_{10}$ alkyl, an aryl $(C_6-C_{20})$ (such as phenyl), an alkyl substituted aryl $(C_6-C_{20})$ (such as -Ph-CH$_3$), an alkylaryl derivative $(C_6-C_{20})$ (such as —CH$_2$Ph) and a linear or branched alkylhydroxyl group (such as HO—CH$_2$—). In the group consisting of structures outlined by (27) styrene glycol is a more specific example.

(27)

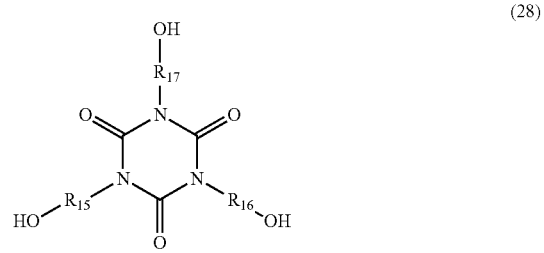

(28)

For the cyanuric acid derivative (28) $R_{15}$, $R_{16}$ and $R_{17}$ are independently a $C_2-C_8$ alkylene spacer. $R_{15}$, $R_{16}$ and $R_{17}$ may all be ethylene spacers (—CH$_2$—CH$_2$—).

The second polymer contains an aminoplast group. Structure 29 shows a general structure for a repeat unit of the second type of polymer which shows a Z moiety derived from a polyol compound linked to at least two aminomethyleneoxy moieties (N—CH$_2$—O—). Y represents the amino moiety within the aminoplast group. The squiggly line represents on Y either an additional aminomethyleneoxy linkage between Z and Y, or indicates possibly unreacted aminomethylenealkoxy or aminomethylenealkoxyhydroxy groups. Unreacted aminomethylenehydroxy may not be present on all Y repeat units but at least some are present in a typical polymer chain to insure crosslinking of the polymer blend.

Structure 30 shows a more specific structure for the second polymer where the aminoplast component is derived from a glycoluril compound where Z is a unit derived from an alkyl polyol (27) with $R_{13}$ as an alkyl substituent or an aromatic polyol with $R_{14}$ as an aryl substituent or (28) a cyanuric acid derivative or a mixture thereof. Structure (30) shows the presence through squiggly lines on the glycoluril moiety lines of either unreacted aminomethylenealkoxy, aminomethylenealkoxyhydroxy groups or additional aminoalkylmethylene linkage to a polyol. Z may contain additional linkages to other moeites.

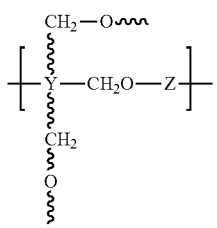

(29)

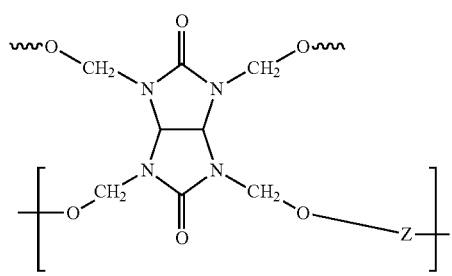

(30)

An example is (31)

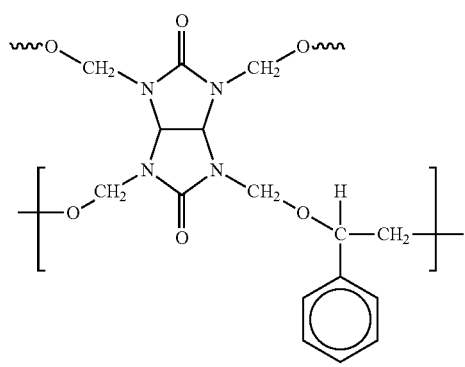

(31)

The second polymer can comprise 30-80% aminoplast unit and 70-20% polyol/polyacid unit. The weight average molecular weight (Mw) of the polymer is about 1,000-100,000 or about 3,000-20,000. The antireflective properties at 193 nm the range of acceptable n and k for the second type of polymer is as follows: n of about 1.6-2.0, and k of about 0.1-0.6. More specially, a range of n of about 1.7-1.95 and k of about 0.12-0.5 is acceptable. To ensure phase separation from the first type of polymer the contact angle of the second polymer with water is between 35° and 65°, or in the range of about 40° to about 60°.

The novel antireflective coating comprising the first polymer and the second polymer, further comprises a thermal acid generator (TAG). The TAG component catalyses crosslinking within the composition. The thermal acid generator used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylakylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diarlyiodonium bis(fluoroalkylsulfonyl)imide, diaryliodonium or quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris (fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA. A specific example of a TAG useful in this invention is the triethylammonium salt of dodecybenzesulfonic acid.

The novel composition comprising the two polymers may further comprise the addition of a secondary crosslinker. A variety of additional crosslinking agents can be used in the composition of the present invention. Any suitable crosslinking agents that can crosslink the polymer in the presence of an acid may be used. Examples, without limitation, of such crosslinking agents are resins containing melamines, methylols, glycoluril, polymeric glycolurils, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6 bishydroxymethyl p-cresol may be used. Epoxy based crosslinkers may also be used.

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalane and diethoxypropane; lactones such as butyrolactone and gamma valerolactone; an amide derivative such as dimethylacetamide or dimethylformamide, anisole, and mixtures thereof.

The composition of the formulation consists of a 1-10 wt % solution in a spin casting solvent (such as PGMEA, PGME, PGMEA/PGME 70/30 etc) of which the essential solid components comprises polymer or mixture of polymers of the first polymer in the range of 1 to 50 wt % or more specifically 2-20 wt % of the solid components; a second polymer in the range of 50-99 wt % with 80-98 wt % of the solid components being preferred; and a TAG component consisting of 0.5-5 wt % of the solid components. Other components may be added such as photoacid generators, other crosslinkers such as monomeric aminoplasts and epoxy crosslinkers and finally fluorosurfactants can be added as leveling agent.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The antireflective coating of the present invention hydrophobicity is important in two respects first in the conventional sense it is important that the top layer of the graded BARC be hydrophobic after forming a coated film, such that the hydrophobicity matches that of the photoresist film coated over the antireflective coating, so that a coating with good uniformity is obtained. However, in this invention hydrophobicity of each individual polymer component in the mixture is also important with regards to ascertaining how well the two polymer components will phase separate from each other and to make sure that the first polymer component migrates to the top of the film where it will be hydrophobic during spin coating but have a base or alkali ionizable moiety to ensure that developer wets the surface once the resist film in exposed areas above are developed through. This minimizes scumming and footing of resist features. Also, the difference in hydrophobicity between the two polymer components is important because it predicates how well the two polymers form a graded film providing an antireflective coating with graded optical properties. The hydrophobicity of the two polymer components film can be measured by the water contact angle ($CA_{Water}$) of the film, where the contact angle is the angle formed by a drop of water on the baked antireflective coating film. Typically the photoresist film used in immersion lithography has a water contact angle of about 80°. Therefore the water contact angle of the antireflective coating film is in a similar range of about 60°-85° or more preferably 70°-80° as detailed previously in the detailed description of the first polymer component which is designed to migrates to the surface of the cross-linked BARC blend. When the photoresist is imaged and developed in an aqueous alkaline developer then the developer contact angle of the antireflective coating film should be lower than the contact angle in water, so that the developer has good wetting capability on the antireflective coating surface and helps to reduce defects. The difference between the contact angle in water and developer is in the range of 5°-15°. The antireflective coating remains on the substrate after development.

The n and k values can be calculated using an ellipsometer, such as the J. A. Woollam WVASE VU-32™ Ellipsometer. The exact values of the optimum ranges for k and n are dependent on the exposure wavelength used and the type of application. Modelling of the n and k values showed that in the film formed from the novel composition a good fit was obtained for a dual layer film with a uniformly mixed intermediate layer. Thus the surface of the film had the n and k values approximating that of the first polymer, the bottom of the film had the n and k values approximating that of the second layer and there was a uniformly mixed layer formed in between the surface and the bottom portions of the film.

The antireflective coating composition is coated on the substrate using techniques well known to those skilled in the art, such as dipping, spin coating or spraying. The film thickness of the antireflective coating ranges from about 15 nm to about 400 nm. The coating is further heated on a hot plate or convection oven for a sufficient length of time to remove any residual solvent and induce crosslinking, and thus insolubilizing the antireflective coating to prevent intermixing between the antireflective coating and the layer to be coated above it. The preferred range of temperature is from about 150° C. to about 280° C. The present antireflective coating may be coated over other layer or layers of antireflective coating(s).

A film of photoresist is coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process. Photoresists useful for immersion lithography are preferred. Typically, photoresists suitable for imaging with immersion lithography may be used, where such photoresists have a refractive index higher than 1.85 and also are hydrophobic having water contact angle in the range of 75° to 95°.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethylammonium hydroxide (TMAH). Mostly, 2.3 weight % TMAH in water is used. The developer may further comprise surfactant(s). An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE32 ellipsometer.

The molecular weight of the polymers was measured on a Gel Permeation Chromatograph.

Static contact angle (SCA) data were collected using VCA 2500XE (Video Contact Angle System) from AST Products, Inc. (9 Linnell Circle, Billerica, Mass. 01821) using Omni-Solv water from EM Science (480 Democrat Road, Gibbstown, N.J. 08027) or AZ® 300MIF Developer (available from AZ® Electronic Materials USA Corp., 70, Meister Ave., Somerville, N.J. 08876). Tests were carried out in Class-1000 Fab environment. Static contact angle were reported as average value from more than five measurements.

Synthesis Example 1

Synthesis of poly(hexafluoroisopropanol methacrylate-co-maleimide-co-hydroxyproryl methacrylate 15.0 g of Isopropyl hexafluoroisopropanol methacrylate (MA-BTHB-OH), 8.9 g of maleimide, 8.7 g of hydroxyproryl methacrylate were mixed with in 120 g of tetrahydrofuran (THF) solvent. The polymerization reaction took place in the presence of 0.7 g of AIBN at 75° C. under nitrogen for 20 h. After cooling down to room temperature, the reaction mixture was precipitated in deionized (DI) water. The white polymer solid was washed and dried in vacuo at 45° C. yielding 29.5 g (90%) with an average MW of 19,000.

Synthesis Example 2

Synthesis of poly(hexafluoroisopropanol methacrylate-co-maleimide-co-hydroxypropyl methacrylate-co-styrene 20.0 g of Isopropyl hexafluoroisopropanol methacrylate (MA-BTHB-OH), 4.1 g of maleimide, 6.0 g of hydroxypropyl methacrylate and 1.8 g of styrene were mixed with in 120 g of THF solvent. The polymerization reaction took place in the presence of 0.7 g of AIBN at 75° C. under nitrogen for 20 h. After cooling down to room temperature, the reaction mixture was precipitated in DI water. The white polymer solid was washed and dried in vacuo at 45° C. yielding 29.7 g (93%) with an average MW of 20000.

Synthesis Example 3

Synthesis of poly(hexafluoroisopropanol methacrylate-co-maleimide-co-hydroxypropyl methacrylate-co-styrene 20.0 g of Isopropyl hexafluoroisopropanol methacrylate (MA-BTHB-OH), 4.1 g of maleimide, 6.0 g of hydroxyproryl methacrylate and 1.8 g of styrene were mixed with in 120 g of PGME solvent. The polymerization reaction took place in the presence of 3.0 g of AIBN at 85° C. under nitrogen for 4 h. After cooling down to room temperature, the reaction mixture was precipitated in DI water. The solid was collected, dried and redissolved in acetone. The solution was precipitated in DI water. The solid product was washed and dried in vacuo at 45° C. yielding a polymer with an average MW of 8000.

Synthesis Example 4

Synthesis of a copolymer of an aminoplast and a polyol 600 grams of tetramethoxymethyl glycoluril, 96 grams of styrene glycol and 1200 grams of PGMEA were charged into a 2 L jacketed flask with a thermometer, mechanical stirrer and a cold water condenser and heated to 85° C. After a catalytic amount of para-toluenesulfonic acid monohydrate was added, the reaction was maintained at this temperature for 5 hrs. The reaction solution was then cooled to room temperature and filtered. The filtrate was slowly poured into distilled water while stirring to precipitate the polymer. The polymer was filtered, washed thoroughly with water and dried in a vacuum oven (250 grams were obtained). The polymer obtained had a weight average molecular weight of about 17,345 g/mol and a polydispersity of 2.7.

Formulation Example 1

1.0 g polymer from Synthesis example 1 was dissolved in 30 g of PGMEA/PGME 70/30 solvent to make a 3.3 wt % solution. 0.1 g of tetramethoxymethyl glycoluril and 0.1 g of 10% of dodecylbenzene sulfonic acid triethylamine salt in PGMEA/PGME 70/30 was added in the polymer solution. The mixture was then filtered through a micro filter with a pore size of 0.2 um. The solution was then spun coated on a silicon wafer for 40 seconds. The coated wafer was then heated on a hot plate for 1 minute at 200° C. The antireflective coating was analyzed on a spectroscopic ellipsometer. The optimized reflective index "n" at 193 nm was 1.60 and the absorption parameter "k" was 0.15.

Formulation Example 2

1.0 g polymer from Synthesis Example 2 was dissolved in 30 g of PGMEA/PGME 70/30 solvent to make a 3.3 wt % solution. 0.15 g of tetramethoxymethyl glycoluril and 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C. The antireflective coating was analyzed on a spectroscopic ellipsometer. The optimized reflective index "n" at 193 nm was 1.63 and the absorption parameter "k" was 0.17.

Formulation Example 3

1.0 g polymer from Synthetic Example 3 was dissolved in 30 g of PGMEA/PGME 70/30 solvent to make a 3.3 wt % solution. 0.15 g of tetramethoxymethyl glycoluril and 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C. The antireflective coating was analyzed on a spectroscopic ellipsometer. The optimized reflective index "n" at 193 nm was 1.63 and the absorption parameter "k" was 0.17.

Formulation Example 4

1.0 g of polymer from Syntheses Example 4 was dissolved in 30 g of PGMEA/PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C. The anti-reflective coating was analyzed on a spectroscopic ellipsometer. The optimized reflective index "n" at 193 nm was 1.89 and the absorption parameter "k" was 0.34.

Formulation Example 5

0.1 g polymer from Synthesis Example 1 and 0.9 g polymer from Synthesis Example 4 was dissolved in 30 g of PGMEA/PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C.

Formulation Example 6

0.2 g polymer from Synthesis Example 1 and 0.8 g polymer from Synthesis Example 4 was dissolved in 30 g of PGMEA/PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C.

Formulation Example 7

0.5 g polymer from Synthesis Example 1 and 0.5 g polymer from Synthesis Example 4 was dissolved in 30 g of PGMEA/PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C.

Formulation Example 8

0.1 g polymer from Synthesis Example 2 and 0.9 g polymer from Synthesis Example 4 was dissolved in 30 g of PGMEA/PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C.

Formulation Example 9

0.2 g polymer from Synthesis Example 2 and 0.8 g polymer from Synthesis Example 4 was dissolved in 30 g of PGMEA/PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C.

Formulation Example 10

0.5 g polymer from Synthesis Example 2 and 0.5 g polymer from Synthesis Example 4 was dissolved in 30 g of PGMEA/PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C.

Formulation Example 11

0.05 g polymer from Synthesis Example 3 and 0.95 g polymer from Synthesis Example 4 was dissolved in 30 g of PGMEA/PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C.

Formulation Example 12

0.1 g polymer from Synthesis Example 3 and 0.9 g polymer from Synthesis Example 4 was dissolved in 30 g of PGMEA/

PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C.

Formulation Example 13

0.2 g polymer from Synthesis Example 3 and 0.8 g polymer from Synthesis Example 4 was dissolved in 30 g of PGMEA/PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C.

Formulation Example 14

0.5 g polymer from Synthesis Example 3 and 0.5 g polymer from Synthesis Example 4 was dissolved in 30 g of PGMEA/PGME 70/30 solvent to make a 3.3 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C.

Evaluation of Resistance to Solvents and Developer for BARC Films

PGMEA/PGME 70:30 solvent was dispensed on the silicon wafer coated with BARC materials from Formulation Examples 1-14. The solvent was removed by nitrogen blowing after 60 s. No significant film losses were observed. Similar experiments were performed with developer, AZ® 300MIF Developer. The coating from Formulation Example 1 (polymer from Synthesis Example 1) dissolved in developer due to the imide content. BARC films from the other Formulation Examples 2-14 demonstrated good resistance to the developer.

Contact Angle Measurements for BARC Coatings

The BARC films resulting from Formulation Examples 1-20 were subjected to contact angle studies. For each coated wafer, five drops of water were added to the center, up, down, left and right areas of wafer. Contact angle of water was measured by using VCA 2500XE system. By averaging these five contact angle data gave the contact angle of water for the BARC's. By using developer (AZ 300 MIF) instead of water, and following the same procedure as described above, the contact angle of developer on BARC was measured. The results are shown Table 1, Table 2, and Table 3 for formulations with top polymers from Synthesis Examples 1, 2, and 3; respectively. For polymers from Synthesis Example 1 and 4 (Table 1), the contact angle increment upon addition of the hydrophobic polymer from Synthesis Example 1 is not as effective as desired. It results from the nature of low fluorinate and high imide content in the polymer. For polymers from Synthesis Example 2 and 4 (Table 2) or polymers from Synthesis Example 3 and 4 (Table 3), significant increase of contact angle with addition of hydrophobic polymers from Synthesis Example 2 or 3 is observed, which indicates a graded top layer is formed. Polymers from Synthesis Example 2 and 3 contain significant amount of hydrophobic units. The result also reveals that the MW of the top layer material does not have significant influence on the gradient behavior.

TABLE 1

CA measurements for formulations of polymers from synthesis example 1 and 4

| Formulation Example | Polymer Composition (wt %) | | Contact angle to water |
|---|---|---|---|
| | Synthesis Example 1 | Synthesis Example 4 | |
| 4 | 0 | 100 | 47.5 |
| 5 | 10 | 90 | 55.0 |
| 6 | 20 | 80 | 58.4 |
| 7 | 50 | 50 | 72.4 |
| 1 | 100 | 0 | 74.4 |

TABLE 2

CA measurements for formulations of polymers from synthesis example 2 and 4

| Formulation Example | Polymer Composition (wt %) | | Contact angle to water |
|---|---|---|---|
| | Synthesis Example 2 | Synthesis Example 4 | |
| 4 | 0 | 100 | 49.6 |
| 8 | 10 | 90 | 70.3 |
| 9 | 20 | 80 | 72.4 |
| 10 | 50 | 50 | 74.4 |
| 2 | 100 | 0 | 78.5 |

TABLE 3

CA measurements for formulations of polymers from synthesis example 3 and 4

| Formulation Example | Polymer Composition (wt %) | | Contact angle to water | Contact angle to developer |
|---|---|---|---|---|
| | Synthesis Example 3 | Synthesis Example 4 | | |
| 4 | 0 | 100 | 47.7 | 51.4 |
| 11 | 5 | 95 | 63.7 | 60.6 |
| 12 | 10 | 90 | 70.3 | 62.9 |
| 13 | 20 | 80 | 72.5 | 63.3 |
| 14 | 50 | 50 | 73.1 | 63.3 |
| 3 | 100 | 0 | 76.8 | 64.4 |

Optical Analysis of Grade Materials

Optical analyses of the graded materials were performed using Variable Angle Spectroscopic Ellipsometry (VASE). The optical dispersion models (WVASE® genosc.mat by J.A.Woolam) for the uniform films from Formulation Examples 2 and 4 were used to model the films formed from the blends of these 2 components which are Formulation Example 8, 9, and 10. Experimental data ($\Delta$, $\psi$)) from phase segregated films were fit to various layered models. Among these were a dual layer, a dual layer with a uniformly mixed intermix region in between, a dual layer with a graded region in between, and a single graded layer. The dual layer with a uniformly mixed intermix region was found to be an excellent fit which is also consistent with the compositions in the formulation and the results obtained by contact angle measurements.

Comparative Lithography Example 1

The lithographic performance of the anti-reflective coating formulation was evaluated using AZ® EXP AX2110P photoresist. The solution of Formulation Example 4 was coated on a silicon wafer and baked at 200° C. for 60 seconds. Using AZ® EXP AX1120P photoresist a 190 nm film was coated and baked at 100° C. for 60 seconds. The wafer was then imagewise exposed using a 193 nm exposure tool. The exposed wafer was baked at 110° C. for 60 seconds and developed using AZ® 300MIF developer for 30 seconds. The line and space patterns when observed under scanning electron microscope showed no standing waves, thus indicating the efficacy of the bottom anti-reflective coating which remained on the substrate after development.

Lithography Example 2

The lithographic performance of the anti-reflective coating formulation was evaluated using AZ® EXP AX2110P photoresist. The solution of Formulation Example 8 was coated on a silicon wafer and baked at 200° C. for 60 seconds. Using AZ® EXP AX1120P photoresist a 190 nm film was coated and baked at 100° C. for 60 seconds. The wafer was then imagewise exposed using a 193 nm exposure tool. The exposed wafer was baked at 110° C. for 60 seconds and developed using AZ® 300MIF developer for 30 seconds. The line and space patterns when observed under scanning electron microscope showed no standing waves, thus indicating the efficacy of the bottom anti-reflective coating. The pattern profile has shown reduced footing/scum comparing to the results from Comparative Lithography Example 1.

The invention claimed is:

1. An antireflective coating comprising a mixture of a first polymer and a second polymer, and a thermal acid generator, where the first polymer comprises at least one fluoroalcohol moiety, at least one aliphatic hydroxyl moiety, and at least one acid moiety other than fluoroalcohol with a pKa in the range of about 8 to about 11; where the second polymer is a reaction product of an aminoplast compound with a compound comprising at least one hydroxyl and/or at least one acid group; wherein the first polymer further comprises a monomeric unit comprising an imide moiety derived from structure (8) or (9)

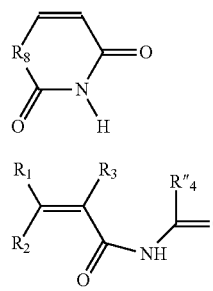

where $R_1$, $R_2$ and $R_3$ are independently selected from hydrogen and $(C_1-C_4)$alkyl, $R''_4$ is a linear $(C_1-C_{10})$alkyl group or an $(C_6-C_{14})$aryl moiety and $R_8$ is a direct valence bond or is a $(C_1-C_{10})$alkylene spacer group.

2. The antireflective coating composition of claim 1, where the first polymer further comprises an aromatic group.

3. The antireflective coating composition of claim 2, where the aromatic group is a unit of structure

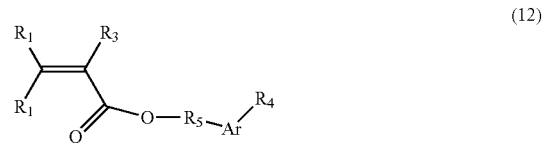

where Ar is an aryl moiety, where $R_1$, $R_2$ and $R_3$ are independently selected from hydrogen and $(C_1-C_4)$alkyl, $R_4$ is a $(C_1-C_{10})$alkyl group or an $(C_6-C_{14})$aryl moiety $R_5$ is a direct valence bond or a spacer group $R_6$ and $R_7$ are independently selected from hydrogen, $(C_1-C_{10})$alkyl group, an aryl moiety $(C_6-C_{14})$, a $(C_2-C_8)$carbonyloxyalkyl, and $(C_2-C_8)$carbonyl.

4. The antireflective coating composition of claim 1 where the first polymer has structure (I)

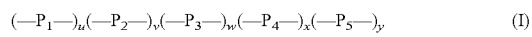

where $P_1$ is a monomeric unit comprising a fluoroalcohol moiety, $P_2$ is a monomeric unit comprising an aliphatic alcohol group; $P_3$ is a monomeric unit comprising an imide moiety of structure 8 or 9; $P_4$ is a monomeric unit comprising a base ionizable arylhydroxy moiety; $P_5$ is an optional monomeric repeat unit comprising an aryl chromophore moiety; u, v, w, x, y are representative of mole % proportion of repeat units in a polymer chain and where u, v, w and x are greater than 0 and y is zero or greater.

5. The antireflective coating composition of claim 1, where the first polymer comprising fluoroalcohol group is a unit of structure (2)

where X is ethylenic unit or substituted ethylenic unit, W is selected from an alkylene and arylene group, and $Rf_1$ and $Rf_2$ are independently a fluoro$(C_1-C_4)$alkyl group.

6. The antireflective coating composition of claim 1, where first polymer comprising the aliphatic hydroxyl moiety is a unit of structure (7)

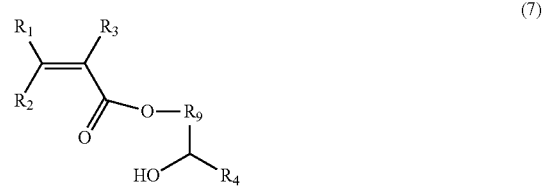

where $R_1$, $R_2$ and $R_3$ are independently selected from hydrogen and $(C_1-C_4)$alkyl, independently selected from hydrogen and $(C_1-C_4)$alkyl, $R_4$ is hydrogen or an ($C_1$-$C_{10}$)alkyl group, and $R_9$ is selected from a direct bond and a ($C_1$-$C_{12}$)alkyl spacer group.

7. The antireflective coating composition of claim 1, where the first polymer comprises an acid moiety other than fluoro-alcohol with a pKa in the range of about 8 to about 11 of structure (10a) or (10b),

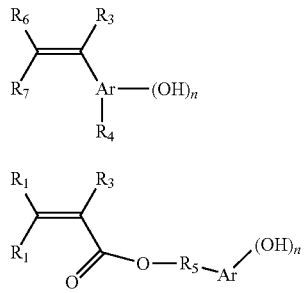

(10a)

(10b)

where Ar is an aryl moiety, where $R_1$, $R_2$ and $R_3$ are independently selected from hydrogen and ($C_1$-$C_4$)alkyl, $R_4$ is a ($C_1$-$C_{10}$)alkyl group or an ($C_6$-$C_{14}$)aryl moiety $R_5$ is a direct valence bond or a spacer group $R_6$ and $R_7$ are independently selected from hydrogen, ($C_1$-$C_{10}$)alkyl group, an aryl moiety ($C_6$-$C_{14}$), a ($C_2$-$C_8$)carbonyloxy-alkyl, and ($C_2$-$C_8$)carbonyl, and n=1-3.

8. The antireflective coating composition of claim 1, where the second polymer is a reaction product of an aminoplast with a polyhydroxyl compound.

9. The antireflective coating composition of claim 1 where the aminoplast is selected from structure 19,

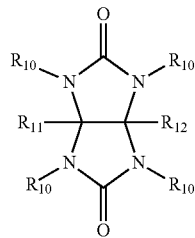

(19)

where each $R_{10}$ is independently $CH_2$—O—$(CH_2)_m$—$CH_3$, m is 0 to 3 and $R_{11}$ and $R_{12}$ are independently hydrogen or $C_1$-$C_{10}$ alkyl.

10. The antireflective coating composition of claim 1 where the hydroxyl compound is selected from structures 27 and 28

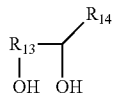

(27)

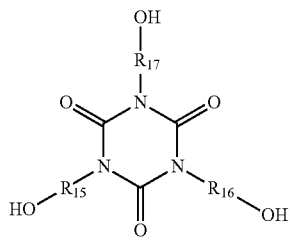

(28)

where $R_{13}$ is a spacer group, $R_{14}$ is selected from hydrogen, $C_1$-$C_{10}$ alkyl, an aryl ($C_6$-$C_{20}$), an ($C_6$-$C_{20}$)alkylaryl, $R_{15}$, $R_{16}$ and $R_{17}$ are independently a $C_2$-$C_8$ alkylene spacer.

11. The antireflective coating composition of claim 1 capable of forming a film where the film has a water contact angle in a range of about 65°-85°.

12. The antireflective coating composition of claim 1 capable of forming a film where the film has a contact angle in a range of about 55°-65° in an aqueous alkaline developer.

13. A process for manufacturing a microelectronic device, comprising;
   a) providing a substrate with a first layer of an antireflective coating composition from claim 1;
   b) coating a photoresist layer above the antireflective coating layers;
   c) imagewise exposing the photoresist layer with deep ultraviolet exposure;
   d) developing the photoresist layer with an aqueous alkaline developing solution.

14. The process of claim 13, where the first antireflective coating layer has an absorption is value as measured by variable angle spectroscopic ellipsometry in the range of about 0.05 to about 0.35.

15. The process of claim 13, where the photoresist is sensitive to exposure to radiation of wavelength from about 250 nm to about 12 nm.

16. The process according to claim 13, where the developing solution is an aqueous solution comprising a hydroxide base.

* * * * *